United States Patent
Asano et al.

(10) Patent No.: US 11,079,676 B2
(45) Date of Patent: Aug. 3, 2021

(54) RADIATION-SENSITIVE COMPOSITION, PATTERN-FORMING METHOD, AND METAL-CONTAINING RESIN AND PRODUCTION METHOD THEREOF

(71) Applicant: JSR CORPORATION, Tokyo (JP)

(72) Inventors: Yusuke Asano, Tokyo (JP); Hisashi Nakagawa, Tokyo (JP); Shinya Minegishi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 112 days.

(21) Appl. No.: 16/449,701

(22) Filed: Jun. 24, 2019

(65) Prior Publication Data

US 2019/0310552 A1    Oct. 10, 2019

Related U.S. Application Data

(63) Continuation of application No. PCT/JP2017/042469, filed on Nov. 27, 2017.

(30) Foreign Application Priority Data

Dec. 28, 2016 (JP) .............................. JP2016-256898

(51) Int. Cl.
| | | |
|---|---|---|
| G03F 7/038 | (2006.01) | |
| G03F 7/20 | (2006.01) | |
| G03F 7/32 | (2006.01) | |
| G03F 7/039 | (2006.01) | |
| C08G 79/12 | (2006.01) | |
| G03F 7/004 | (2006.01) | |
| C08F 12/14 | (2006.01) | |

(52) U.S. Cl.
CPC ............ *G03F 7/038* (2013.01); *C08G 79/12* (2013.01); *G03F 7/004* (2013.01); *G03F 7/039* (2013.01); *G03F 7/20* (2013.01); *G03F 7/32* (2013.01); *G03F 7/325* (2013.01); *C08F 12/14* (2013.01)

(58) Field of Classification Search
CPC . G03F 7/038; G03F 7/32; G03F 7/004; G03F 7/039; G03F 7/20; G03F 7/325; G03F 7/322; G03F 7/0043; G03F 7/0042; C08G 79/12; C08F 12/14

USPC ............................................. 430/270.1, 325
See application file for complete search history.

(56) References Cited

U.S. PATENT DOCUMENTS

| | | | |
|---|---|---|---|
| 5,100,762 A | 3/1992 | Tanaka et al. | |
| 8,697,335 B2 | 4/2014 | Nakahara et al. | |
| 2012/0148952 A1 | 6/2012 | Nakahara et al. | |
| 2014/0272706 A1* | 9/2014 | Kon ..................... | C07F 7/0838 430/270.1 |
| 2016/0116839 A1 | 4/2016 | Meyers et al. | |
| 2020/0064733 A1 | 2/2020 | Meyers et al. | |

FOREIGN PATENT DOCUMENTS

| | | |
|---|---|---|
| JP | 63-253939 A | 10/1988 |
| JP | 4-127159 A | 4/1992 |
| JP | 11-125907 A | 5/1995 |
| JP | 8-146610 A | 6/1996 |
| JP | 2000-298347 A | 10/2000 |
| JP | 2001-166476 A | 6/2001 |
| JP | 2002-122994 A | 4/2002 |
| JP | 2002-196494 A | 7/2002 |
| JP | 2003-5376 A | 1/2003 |
| JP | 2011-114431 A | 5/2007 |
| JP | 2010-164958 A | 7/2010 |
| JP | 2014-182201 A | 9/2014 |
| JP | 2016-530565 A | 9/2016 |
| WO | WO 2011/007780 A1 | 1/2011 |

OTHER PUBLICATIONS

International Search Report and Written Opinion dated Feb. 20, 2018 in PCT/JP2017/042469, 24 pages (with English translation).
Extended European Search Report dated Sep. 14, 2020 in European Patent Application No. 17887183.6, 8 pages.

* cited by examiner

*Primary Examiner* — Caleen O Sullivan
(74) *Attorney, Agent, or Firm* — Oblon, McClelland, Maier & Neustadt, L.L.P.

(57) ABSTRACT

A radiation-sensitive composition is to be used in exposure with an extreme ultraviolet ray or an electron beam, and includes a first polymer and a solvent, wherein the first polymer includes a first structural unit including: at least one metal atom; and at least one carbon atom that each bonds to the metal atom by a chemical bond and does not constitute an unsaturated bond, and at least one chemical bond is a covalent bond. Every chemical bond is preferably a covalent bond. The metal atom is preferably tin, germanium, lead or a combination thereof.

23 Claims, No Drawings

RADIATION-SENSITIVE COMPOSITION, PATTERN-FORMING METHOD, AND METAL-CONTAINING RESIN AND PRODUCTION METHOD THEREOF

CROSS-REFERENCE TO RELATED APPLICATIONS

The present application is a continuation application of International Application No. PCT/JP2017/042469, filed on Nov. 27, 2017, which claims priority to Japanese Patent Application No. 2016-256898, filed on Dec. 28, 2016. The contents of these applications are incorporated herein by reference in their entirety.

BACKGROUND OF THE INVENTION

Field of Invention

The present invention relates to a radiation-sensitive composition, a pattern-forming method, and a metal-containing resin and a production method thereof.

Description of the Related Art

A radiation-sensitive composition for use in microfabrication by lithography generates an acid at a light-exposed region upon irradiation with an electromagnetic wave such as a far ultraviolet ray (e.g., ArF excimer laser beam, KrF excimer laser beam, etc.) or an extreme ultraviolet ray (EUV), a charged particle ray such as an electron beam. A chemical reaction in which the acid serves as a catalyst causes the difference in rates of dissolution in a developer solution, between light-exposed regions and light-unexposed regions to form a pattern on a substrate.

Such radiation-sensitive compositions are demanded to have improved resist performances along with miniaturization in processing techniques. To meet such demands, types, molecular structures and the like of polymers, acid generating agents and other components which may be used in the compositions have been investigated, and combinations thereof have been further investigated in detail (see, Japanese Unexamined Patent Application, Publication Nos. H11-125907, H8-146610 and 2000-298347).

At present, miniaturization of patterns has proceeded to a level for line widths of no greater than 40 nm, and radiation-sensitive compositions are needed to have further various resist performances, and high sensitivity particularly to exposure light such as an electron beam or EUV. In addition, superior inhibitory ability of particle generation, as well as less formation over time of particles which are insoluble matters that may cause defects and the like is desired. Moreover, there exist demands for: inhibition of occurrence of repelling, coating unevenness, halation and the like; and coating characteristics being superior, as well as less generation of defects in a film obtained; inhibitory ability of defects being superior; and further these coating characteristics and inhibitory ability of defects being maintained even after storage for a long period of time, with storage stability being superior. However, the conventional radiation-sensitive compositions have not satisfied all these demands.

SUMMARY OF THE INVENTION

The present invention was made in view of the foregoing circumstances, and an object of the invention is to provide a radiation-sensitive composition, a pattern-forming method, a metal-containing resin and a production method of a metal-containing resin, each being accompanied by superior sensitivity and inhibitory ability of particle generation, as well as superior coating characteristics and inhibitory ability of defects, with enabling these performances to be maintained for a long period of time.

According to one aspect of the invention made for solving the aforementioned problems, a radiation-sensitive composition is to be used in exposure with an extreme ultraviolet ray or an electron beam, and contains a first polymer (hereinafter, may be also referred to as "(A) polymer" or "polymer (A)") and a solvent (hereinafter, may be also referred to as "(B) solvent" or "solvent (B)"), in which the polymer (A) has a first structural unit (hereinafter, may be also referred to as "structural unit (I)") comprising: at least one metal atom; and at least one carbon atom that each bonds to the metal atom by a chemical bond and does not constitute an unsaturated bond, and at least one chemical bond is a covalent bond.

According to other aspect of the invention made for solving the aforementioned problems, a pattern-forming method includes: applying the radiation-sensitive composition according to the one aspect directly or indirectly on one face side of a substrate; exposing a film provided by the applying; and developing the film exposed.

According to still other aspect of the invention made for solving the aforementioned problems, a metal-containing resin has a structural unit (structural unit (I)) including: at least one metal atom; and at least one carbon atom that each bonds to the metal atom by a chemical bond and does not constitute an unsaturated bond, in which at least one chemical bond is a covalent bond.

According to yet other aspect of the invention made for solving the aforementioned problems, a production method of the metal-containing resin according to the still other aspect, the production method including: forming a main chain of a polymer by chain polymerization with a radical, an anion or a cation.

The radiation-sensitive composition according to the one aspect of the present invention is superior in sensitivity and inhibitory ability of particle generation, as well as superior in coating characteristics and inhibitory ability of defects, and enables these performances to be maintained for a long period of time. The pattern-forming method according to the other aspect of the present invention enables a pattern with less defect to be formed. The metal-containing resin according to the still other aspect of the present invention can be suitably used as a polymer component of the radiation-sensitive composition of the one aspect. The production method of a metal-containing resin of the yet other aspect of the present invention enables the metal-containing resin to be readily produced with good yield. Therefore, these can be suitably used in manufacture of semiconductor devices in which further progress of miniaturization is expected in the future.

DESCRIPTION OF THE EMBODIMENTS

Hereinafter, embodiments of the present invention will be described, but the present invention is not in any way limited to the embodiments. In other words, the embodiments which may be altered and/or modified as appropriate on the basis of the common knowledge of one of ordinary skill in the art within a range not departing from principles of the present invention are to be construed to fall within the scope of the present invention.

Radiation-Sensitive Composition

The radiation-sensitive composition of one embodiment of the invention is to be used in exposure with an extreme ultraviolet ray or an electron beam. The radiation-sensitive composition contains the polymer (A) and the solvent (B). The radiation-sensitive composition may contain a radiation-sensitive acid generator (hereinafter, may be also referred to as "(C) acid generator" or "acid generator (C)") as a favorable component, and may also contain other optional component within a range not leading to impairment of the effects of the present invention. Hereinafter, each component will be described.

(A) Polymer

The polymer (A) is a polymer (metal-containing resin) having the structural unit (I). The term "polymer" as referred to herein means a chain compound having no less than two structural units and having a main chain, and compounds such as clusters in which structural units are linked to form a cyclic structure is not involved. The term "main chain" as referred to herein means a longest one among chains of atoms included in the polymer (A). The term "side chain" as referred to herein means any chain of atoms, other than the main chain, included in the polymer (A).

Due to the polymer (A) having the structural unit (I), the radiation-sensitive composition is accompanied by superior sensitivity and inhibitory ability of particle generation, as well as superior coating characteristics and inhibitory ability of defects, with enabling these performances to be maintained for a long period of time (hereinafter, the feature of enabling these performances to be maintained for a long period of time may be also referred to as "storage stability"). Although not necessarily clarified and without wishing to be bound by any theory, the reason for achieving the effects described above due to the radiation-sensitive composition having the aforementioned constitution is inferred as in the following, for example. Specifically, the polymer (A) has the structural unit (1), and in the structural unit (1), at least one metal atom, and at least one carbon atom that each bonds to the metal atom by a chemical bond and does not constitute an unsaturated bond are included, in which at least one chemical bond is a covalent bond. It is considered that due to having such a covalent bond between the [metal]-[carbon atom not constituting the unsaturated bond], the polymer (A) generates a radical through cleavage upon an exposure with EUV, an electron beam or the like, and bonding between the radicals on the polymer (A) molecules would result in an increase in molecular weight, leading to a change in a solubility in a developer solution. Therefore, the radiation-sensitive composition is capable of improving the sensitivity, and particle generation is inhibited since structural change of the polymer (A) in the case of not being exposed is inhibited. In addition, due to being a compound having appropriate polarity, such a polymer (A) is superior in coating characteristics. Moreover, it is believed that the radiation-sensitive composition enables a pattern to be formed with less defect owing to the inhibitory ability of particle generation and the like described above, and that coating characteristics and inhibitory ability of defects can be maintained for a long period of time leading to superior storage stability, owing to the structural change being inhibited in the case of not being exposed.

In addition to the structural unit (I), the polymer (A) may have: a structural unit (II) that includes a polar group; a structural unit (III) that includes a crosslinkable group; and a structural unit (IV) that includes an acid-labile group, and may also have a structural unit other than (I) to (IV). Hereinafter, each structural unit will be described.

Structural Unit (I)

The structural unit (I) includes: at least one metal atom; and at least one carbon atom (hereinafter, may be also referred to as "carbon atom (A)") that each bonds to the metal atom by a chemical bond and does not constitute an unsaturated bond, in which at least one chemical bond is a covalent bond. "Chemical bonds" are classified into covalent bonds and ionic bonds. The term "covalent bond" as referred to means a chemical bond having the difference in Pauling's electronegativity of two atoms that are bonding is no greater than 1.6. The term "ionic bond" as referred to means a chemical bond of which difference in Pauling's electronegativity of two atoms that are bonding is greater than 1.6.

The metal atom is exemplified by metal atoms from group 1 to group 16, and the like. The metal atom does not include a metalloid atom (boron, silicon, arsenic, tellurium and astatine). The metal atom is preferably an atom from group 13 to group 16, and more preferably an atom from group 14, in light of the group being the same as that of a carbon atom which is a nonmetal atom, and an capability of forming an adequately strong covalent bond. Furthermore, in light of capability of forming a more adequately strong covalent bond with a nonmetal atom, the metal atom is preferably a metal atom of period 4 or the following period, and more preferably a metal atom of period 4, period 5 or period 6. As the metal atom, tin, germanium and lead are preferred.

The carbon atom (A) is exemplified by a carbon atom bonding to other atom with only a single bond, and the like. Examples of the carbon atom (A) include a carbon atom of a methyl group, a carbon atom of a methanediyl group, a carbon atom of a methanetriyl group, a carbon atom of a methanetetrayl group, and the like.

A nonmetal atom which may bond to the metal atom in addition to the carbon atom (A) is exemplified by a carbon atom constituting an unsaturated bond, an oxygen atom, a nitrogen atom, a sulfur atom, a phosphorus atom, a selenium atom, a halogen atom, and the like. Examples of the halogen atom include a fluorine atom, a chlorine atom, a bromine atom, an iodine atom and the like.

The bond formed by the metal atom (M) and the nonmetal atom other than the carbon atom (A) bonding to the metal atom via a chemical bond is exemplified by an M-C (carbon atom constituting an unsaturated bond) bond, an M-O bond, an M-N bond, an M-S bond, an M-µ bond, an M-Se bond, an M-X (wherein, X represents a halogen atom) bond, and the like. Of these, the M-C bond and the M-O bond are preferred.

In a case in which the metal atom is a tin atom, a germanium atom or lead atom (M'), the bond formed by the metal atom and the nonmetal atom other than the carbon atom (A) bonding to the metal atom via a chemical bond is exemplified by covalent bonds such as an M'—C (carbon atom constituting an unsaturated bond) bond, an M'—O bond, an M'—N bond, an M'—S bond, an M'—P bond and an M'—Se bond, and the like. Of these, in light of being an adequately strong covalent bond, the M'—C bond and the M'—O bond are preferred.

In the structural unit (I), at least one of the chemical bond between the metal atom and the carbon atom (A) is a covalent bond, and it is preferred that every chemical bond between the metal atom and the carbon atom (A) is a covalent bond. When every chemical bond is thus a covalent bond, the sensitivity of the radiation-sensitive composition can be more improved.

The polymer (A) may have the metal atom in any of the main chain or the side chain thereof.

Examples of the structural unit (I) include structural units represented by the following formulae (1-1) to (1-3) (hereinafter, may be also referred to as "structural units (I-1) to (I-3)"), and the like. The structural unit (1-1) has the metal atom in the main chain thereof. The structural units (I-2) and (I-3) have the metal atom in the side chain thereof.

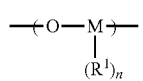

(1-1)

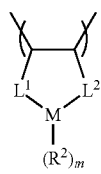

(1-2)

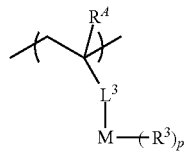

(1-3)

In the above formulae (1-1) to (1-3), M represents a metal atom.

In the above formula (1-1), $R^1$ represents a monovalent organic group having 1 to 20 carbon atoms; and n is an integer of 1 to 4, wherein in a case in which n is no less than 2, a plurality of $R^1$s may be identical or different, and at least one of one or a plurality of $R^1$s bonds to M via the carbon atom (A).

In the above formula (1-2), $L^1$ and $L^2$ each independently represent a divalent linking group having 1 to 30 atoms; $R^2$ represents a monovalent organic group having 1 to 20 carbon atoms; and m is an integer of 1 to 4, wherein in a case in which m is no less than 2, a plurality of $R^2$s may be identical or different; and at least one of $L^1$, $L^2$ and one or a plurality of $R^2$s bonds to M via the carbon atom (A).

In the above formula (1-3), $R^4$ represents a hydrogen atom or a monovalent organic group having 1 to 10 carbon atoms; $L^3$ represents a divalent linking group having 1 to 30 atoms; $R^3$ represents a monovalent organic group having 1 to 20 carbon atoms; and p is an integer of 1 to 5, wherein in a case in which p is no less than 2, a plurality of $R^3$s may be identical or different, and at least one of $L^3$ and one or a plurality of $R^3$s bonds to M via the carbon atom (A).

The term "organic group" as referred to herein means a group that includes at least one carbon atom. Moreover, the "hydrocarbon group" herein may include a chain hydrocarbon group, an alicyclic hydrocarbon group and an aromatic hydrocarbon group. This "hydrocarbon group" may be a saturated hydrocarbon group or an unsaturated hydrocarbon group. The "chain hydrocarbon group" as referred to herein means a hydrocarbon group not including a ring structure but comprising only a chain structure, and both a straight chain hydrocarbon group and a branched chain hydrocarbon group may be involved. The "alicyclic hydrocarbon group" as referred to herein means a hydrocarbon group not including an aromatic ring structure but comprising only an alicyclic structure as the ring structure, and both a monocyclic alicyclic hydrocarbon group and a polycyclic alicyclic hydrocarbon group may be involved. However, the alicyclic hydrocarbon group does not need to be constituted with only the alicyclic structure, and a part thereof may include a chain structure. The "aromatic hydrocarbon group" as referred to herein means a hydrocarbon group including an aromatic ring structure as the ring structure. However, the aromatic hydrocarbon group does not need to be constituted with only the aromatic ring structure, and a part thereof may include a chain structure and/or an alicyclic structure.

The metal atom represented by M is preferably a metal atom from group 1 to group 16, more preferably a metal atom from group 13 to group 15, still more preferably a metal atom from group 14, and particularly preferably tin, germanium or lead.

The monovalent organic group represented by $R^1$, $R^2$ and $R^3$ is exemplified by: a monovalent hydrocarbon group having 1 to 20 carbon atoms; a group (α) that includes a divalent hetero atom-containing group between two adjacent carbon atoms or at the end of the atomic bonding side of the monovalent hydrocarbon group having 1 to 20 carbon atoms; a group obtained from the monovalent hydrocarbon group having 1 to 20 carbon atoms, or the group (α) by substituting a part or all of hydrogen atoms included therein with a monovalent hetero atom-containing group; and the like.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

monocyclic alicyclic saturated hydrocarbon groups such as a cyclopentyl group, a cyclohexyl group, a cyclopentylmethyl group and a cyclohexylmethyl group;

monocyclic alicyclic unsaturated hydrocarbon groups such as a cyclopentenyl group and a cyclohexenyl group;

polycyclic alicyclic saturated hydrocarbon groups such as a norbornyl group, an adamantyl group, a tricyclodecyl group, a norbornan-2-ylmethyl group and an adamantyl methyl group;

polycyclic alicyclic unsaturated hydrocarbon groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group, a naphthylmethyl group and an anthryl methyl group; and the like.

Examples of the hetero atom constituting the monovalent hetero atom-containing group or the divalent hetero atom-containing group include an oxygen atom, a nitrogen atom, a sulfur atom, a phosphorus atom, a halogen atom, and the like. Examples of the halogen atom include a fluorine atom, a chlorine atom, a bromine atom, an iodine atom, and the like.

The divalent hetero atom-containing group is exemplified by —O—, —CO—, —S—, —CS—, —NR'—, a group obtained by combining two or more of these, and the like, wherein R' represents a hydrogen atom or a monovalent hydrocarbon group. Of these, —O— is preferred.

Examples of the monovalent hetero atom-containing group include halogen atoms such as a fluorine atom, a chlorine atom, a bromine atom and an iodine atom, a hydroxy group, a carboxy group, a cyano group, an amino group, a sulfanyl group (—SH), and the like. Of these, a cyano group and a fluorine atom are preferred.

$R^1$, $R^2$ and $R^3$ each represent preferably a monovalent hydrocarbon group having 1 to 20 carbon atoms, more preferably a monovalent chain hydrocarbon group having 1 to 20 carbon atoms or a monovalent aromatic hydrocarbon group having 6 to 20 carbon atoms, still more preferably an alkyl group having 1 to 20 carbon atoms, an alkenyl group having 2 to 20 carbon atoms or an aralkyl group having 7 to 20 carbon atoms, and particularly preferably a methyl group, a n-butyl group, an allyl group or a benzyl group.

Of the monovalent organic groups having 1 to 20 carbon atoms which may be represented by $R^1$, $R^2$ and $R^3$, examples of the group bonding to M via the carbon atom (A) include: alkyl groups such as a methyl group and a n-butyl group; alkenyl groups in which the carbon atom of the atomic bonding does not constitute a double bond, such as an allyl group; aralkyl groups such as a benzyl group; groups obtained by substituting with a monovalent substituent, a part or all of hydrogen atoms included in these groups; and the like. Of these, the alkyl group, the allyl group and the aralkyl group are preferred, and a methyl group, a n-butyl group, an allyl group and a benzyl group are more preferred.

The divalent linking group having 1 to 30 atoms is exemplified by —O—, —NR'—, —S—, a divalent organic group having 1 to 20 carbon atoms, and the like, wherein R' represents a hydrogen atom or a monovalent hydrocarbon group having 1 to 10 carbon atoms. Examples of the divalent organic group having 1 to 20 carbon atoms which may be represented by $L^1$, $L^2$ and $L^3$ include groups obtained by removing one hydrogen atom from the monovalent organic group having 1 to 20 carbon atoms which may be represented by $R^1$, $R^2$ and $R^3$ described above, and the like. With respect to the divalent organic groups having 1 to 20 carbon atoms which may be represented by $L^1$, $L^2$ and $L^3$, which bonds to M via the carbon atom (A), the carbon atom bonding to M may constitute a methanediyl group, a methanetriyl group, a methanetetrayl group, or the like.

The monovalent organic group having 1 to 10 carbon atoms which may be represented by $R^4$ is exemplified by groups having 1 to 10 carbon atoms among the groups exemplified as the monovalent organic groups having 1 to 20 carbon atoms which may be represented by $R^1$, $R^2$ and $R^3$, and the like.

$R^4$ represents preferably a hydrogen atom or a chain hydrocarbon group having 1 to 5 carbon atoms.

In the above formula, n is preferably 2 to 4, and more preferably 2 and 3.

In the above formula, m is preferably 2 to 4, and more preferably 2 and 3.

In the above formula, p is preferably 2 to 5, more preferably 2 to 4, and still more preferably 2 and 3.

In a case in which the metal atom is a tin atom, examples of the structural unit (I-1) include structural units represented by the following formulae (1-1-1) to (1-1-5), etc., examples of the structural unit (I-2) include a structural unit represented by the following formula (1-2-1), etc., and examples of the structural unit (I-3) include structural units represented by the following formulae (1-3-1) to (1-3-6), etc.

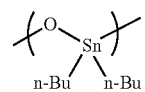
(1-1-1)

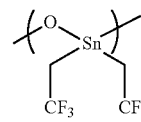
(1-1-2)

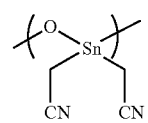
(1-1-3)

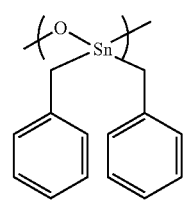
(1-1-4)

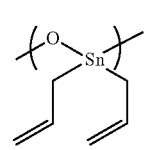
(1-1-5)

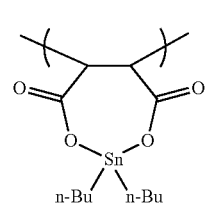
(1-2-1)

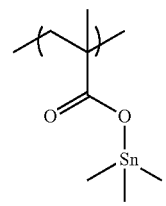
(1-3-1)

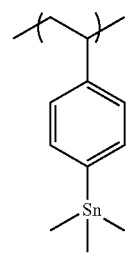
(1-3-2)

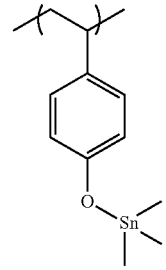
(1-3-3)

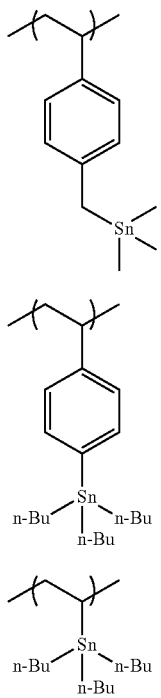

(1-3-4)

(1-3-5)

(1-3-6)

The structural unit (I-1) may be formed by, for example, subjecting a compound (hereinafter, may be also referred to as "compound (I)") represented by the following formula (1) to hydrolysis and/or hydrolytic condensation. The radiation-sensitive composition can have more improved sensitivity by forming the polymer (A) from the compound (I).

$$(R-L)_a M X_b \quad (1)$$

In the above formula (1), M represents tin, germanium or lead; L represents a single bond or a linking group; R represents an unsaturated bond-containing group, or a halogenated hydrocarbon group; a is an integer of 1 to 3, wherein in a case in which a is no less than 2, a plurality of Rs may be identical or different, a plurality of Ls may be identical or different; X represents a hydrolyzable group selected from a halogen atom, an alkoxy group and a carboxylate group or a crosslinkable group; and b is an integer of 1 to 5, wherein in a case in which b is no less than 2, a plurality of Xs may be identical or different.

The number of carbon atoms of the linking group which may be represented by L is preferably 0 to 10, more preferably 1 to 10, still more preferably 1 to 5, and particularly preferably 1 to 3.

The linking group which may be represented by L is exemplified by alkanediyl groups such as a linear alkanediyl group, and a branched alkanediyl group, and the like.

Examples of the linear alkanediyl group include a methanediyl group, a 1,2-ethanediyl group, a 1,3-propanediyl group, a 1,4-butanediyl group, a 1,5-pentanediyl group, and the like.

Examples of the branched alkanediyl group include a group represented by the following formula (L-1), a group represented by the following formula (L-2), and the like.

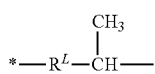

(L-1)

(L-2)

In the above formulae (L-1) and (L-2), $R^L$ represents a single bond or an alkanediyl group having 1 to 7 carbon atoms; and * denotes a site to be bonded to R in the above formula (1).

$R^L$ represents preferably a single bond or a linear alkanediyl group, and more preferably a single bond.

L represents preferably a linking group, more preferably an alkanediyl group, still more preferably an alkanediyl group having 1 to 5 carbon atoms, and particularly preferably a methanediyl group.

Examples of the unsaturated bond in the unsaturated bond-containing group which may be represented by R include: carbon-carbon double bonds such as an ethylenic double bond and an aromatic double bond; double bonds such as a carbon-oxygen double bond and a carbon-nitrogen double bond, as well as carbon-carbon triple bonds such as an acetylenic triple bond; triple bonds such as a carbon-nitrogen triple bond; and the like. Of these, the carbon-carbon double bond and the carbon-nitrogen triple bond are preferred, the ethylenic double bond, the aromatic double bond and the carbon-nitrogen triple bond are more preferred, and the ethylenic double bond is still more preferred.

Examples of the unsaturated bond-containing group which may be represented by R include carbon-carbon double bond-containing groups, e.g.:

ethylenic double bond-containing groups such as an ethenyl group and a (meth)acryl group;

acetylenic triple bond-containing groups such as an ethynyl group;

aromatic ring-containing groups such as a phenyl group, a tolyl group, a naphthyl group and a hydroxyphenyl group, as well as carbon-oxygen double bond-containing groups such as a carbonyl group, carbon-nitrogen triple bond-containing groups such as a cyano group, and the like. Of these, the carbon-carbon double bond-containing group and the carbon-nitrogen triple bond-containing group are preferred, the ethylenic double bond-containing group, the aromatic ring-containing group and the carbon-nitrogen triple bond-containing group are more preferred, the ethylenic double bond-containing group and the aromatic ring-containing group are still more preferred, and an ethenyl group and a phenyl group are particularly preferred.

Examples of the halogenated hydrocarbon group which may be represented by R include:

fluorinated hydrocarbon groups such as a fluoromethyl group, a trifluoromethyl group and a fluorophenyl group;

chlorinated hydrocarbon groups such as a chloromethyl group, a trichloromethyl group and a chlorophenyl group;

brominated hydrocarbon groups such as a bromomethyl group, a tribromomethyl group and a bromophenyl group;

iodinated hydrocarbon groups such as an iodomethyl group, a triiodomethyl group and an iodophenyl group, and the like. Of these, the fluorinated hydrocarbon group is preferred, and a trifluoromethyl group is more preferred.

It is preferred that the carbon atom constituting the unsaturated bond in R, or the carbon atom to which the halogen atom bonds in the halogenated hydrocarbon group which may be represented by R directly bonds to L. When the specific carbon atom in R directly bonds to L, the sensitivity of the radiation-sensitive composition can be further improved.

In the above formula, a is preferably 1 and 2, and more preferably 2. In the above formula, b is preferably 2 and 3, and more preferably 2. The sum, (a+b) is typically no greater than 6, and more preferably no greater than 4.

X represents preferably a halogen atom, and more preferably a chlorine atom.

The lower limit of the proportion of the structural unit (I) contained is, with respect to the total structural units constituting the polymer (A), is preferably 10 mol %, more preferably 30 mol %, still more preferably 40 mol %, and particularly preferably 50 mol %. The upper limit of the proportion of the polymer (A) contained is preferably 100 mol %, more preferably 90 mol %, still more preferably 80 mol %, and particularly preferably 70 mol %.

Structural Unit (II)

The structural unit (11) is a structural unit that includes a polar group (excluding those corresponding to the structural unit (I)). When the polymer (A) further has the structural unit (II) in addition to the structural unit (I), solubility in a developer solution can be more adequately adjusted, and as a result, more improving the inhibitory ability of particle generation, the coating characteristics, the inhibitory ability of defects and the storage stability, of the radiation-sensitive composition, is enabled.

Examples of the polar group include hydroxyl groups, amino groups, imino groups, cyano groups, carbonyl groups, and the like. The hydroxyl groups involve both alcoholic hydroxyl groups and phenolic hydroxyl groups. Of these, phenolic hydroxyl groups, imino groups and carbonyl groups are preferred.

The structural unit (II) is exemplified by a structural unit that includes a phenolic hydroxyl group (hereinafter, may be also referred to as "structural unit (II-1)"), a structural unit that includes an alcoholic hydroxyl group (hereinafter, may be also referred to as "structural unit (II-2)"), a structural unit that is derived from a maleimide compound (hereinafter, may be also referred to as "structural unit (II-3)"), and the like.

Examples of the structural unit (II-1) include a structural unit represented by the following formula (2), and the like.

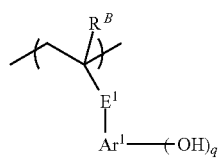

(2)

In the above formula (2), $R^B$ represents a hydrogen atom or a monovalent organic group having 1 to 10 carbon atoms; $E^1$ represents a single bond, —O— or a divalent organic group having 1 to 20 carbon atoms; $Ar^1$ represents an arenediyl group having 6 to 20 carbon atoms; and q is an integer of 1 to 3.

$R^B$ represents preferably a hydrogen atom.

$E^1$ represents preferably a single bond, —O— or —COO—, and more preferably a single bond.

Examples of the arenediyl group having 6 to 20 carbon atoms represented by $Ar^1$ include a benzenediyl group, a naphthalenediyl group, an anthracenediyl group, a phenanthrenediyl group, a pyrenediyl group, and the like. Of these, a benzenediyl group and a naphthalenediyl group are preferred, and a benzenediyl group is more preferred.

In the above formula, q is preferably 1 and 2, and more preferably 1.

The structural unit (II-1) is exemplified by a structural unit derived from hydroxystyrene, a structural unit derived from hydroxyvinylnaphthalene, and the like. Of these, the structural unit derived from hydroxystyrene is preferred.

The structural unit (II-2) is exemplified by a structural unit derived from 2-hydroxyethyl (meth)acrylate, a structural unit derived from 3-hydroxyadamantan-1-yl (meth)acrylate, a structural unit derived from 4-hydroxycyclohexan-1-yl (meth)acrylate, and the like. Of these, the structural unit derived from 3-hydroxyadamantan-1-yl (meth)acrylate is preferred.

The structural unit (II-3) is exemplified by a structural unit represented by the following formula (4), and the like. The structural unit (II-3) has a carbonyl group and an imino group as the polar group.

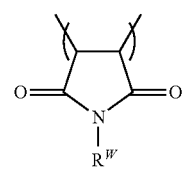

(4)

In the above formula (4), $R^W$ represents a monovalent organic group having 1 to 20 carbon atoms.

Examples of the monovalent organic group having 1 to 20 carbon atoms represented by $R^W$ include groups similar to those exemplified as the monovalent organic group having 1 to 20 carbon atoms which may be represented by $R^1$, $R^2$ and $R^3$, and the like.

$R^W$ represents preferably a monovalent aromatic hydrocarbon group having 6 to 20 carbon atoms, more preferably an aryl group having 6 to 20 carbon atoms, and particularly preferably a phenyl group.

The lower limit of the proportion of the structural unit (II) contained is preferably 5 mol %, more preferably 10 mol %, still more preferably 20 mol %, and particularly preferably 30 mol %. The upper limit of the proportion of the structural unit (II) contained is preferably 80 mol %, more preferably 60 mol %, still more preferably 50 mol %, and particularly preferably 40 mol %.

Structural Unit (III)

The structural unit (III) is a structural unit that includes a crosslinkable group (excluding those corresponding to the structural unit (I)). The term "crosslinkable group" as referred to herein means a group capable of forming a covalent bond within a molecule and/or between/among different molecules. When the polymer (A) further has the structural unit (III) in addition to the structural unit (I), the molecular weight is adequately increased through curing. As a result, more improving the inhibitory ability of particle generation, the coating characteristics, the inhibitory ability of defects and the storage stability, of the radiation-sensitive composition, is enabled.

Examples of the crosslinkable group include:
epoxy groups such as an oxiranyl group and an oxetanyl group;
polymerizable carbon-carbon double bond-containing groups such as a vinyl group, an allyl group, a styryl group and a (meth)acryloyl group;

carbon-carbon triple bond-containing groups such as an ethynyl group and a propargyl group, and the like.

The lower limit of the proportion of the structural unit (III) contained is preferably 5 mol %, more preferably 10 mol %, still more preferably 15 mol %, and particularly preferably 20 mol %. The upper limit of the proportion of the structural unit (III) contained is preferably 60 mol %, more preferably 50 mol %, still more preferably 40 mol %, and particularly preferably 30 mol %.

Structural Unit (IV)

The structural unit (IV) is a structural unit that includes an acid-labile group. The term "acid-labile group" as referred to herein is a group that will substitute for the hydrogen atom included in a carboxy group, a phenolic hydroxyl group or the like, and means a group that will be dissociated by an action of an acid. When the polymer (A) has the structural unit (IV), the solubility in a developer solution can be more adequately adjusted, and as a result, more improving the inhibitory ability of particle generation, the coating characteristics, the inhibitory ability of defects and the storage stability, of the radiation-sensitive composition, is enabled.

The structural unit (IV) is exemplified by a structural unit represented by the following formula (3), and the like.

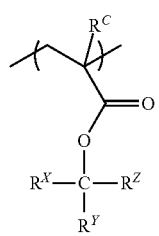

(3)

In the above formula (3), $R^C$ represents a hydrogen atom or a monovalent organic group having 1 to 10 carbon atoms; $R^X$ represents a monovalent hydrocarbon group having 1 to 20 carbon atoms; $R^Y$ and $R^Z$ each independently represent a monovalent hydrocarbon group having 1 to 20 carbon atoms, or $R^Y$ and $R^Z$ taken together represent a ring structure having 3 to 20 ring atoms together with the carbon atom to which $R^Y$ and $R^Z$ bond.

The number of "ring atoms" as referred to herein means the number of atoms constituting the ring in an alicyclic structure, an aromatic ring structure, an aliphatic heterocyclic structure or an aromatic heterocyclic structure, and in the case of polycyclic, the number of "ring atoms" means the number of atoms constituting the polycycle.

$R^C$ represents, in light of a degree of copolymerization of a monomer that gives the structural unit (IV), preferably a hydrogen atom or a methyl group, and more preferably a methyl group.

$R^X$ represents preferably a monovalent hydrocarbon group having 1 to 10 carbon atoms, more preferably an alkyl group having 1 to 10 carbon atoms or an aryl group having 6 to 10 carbon atoms, and still more preferably a methyl group, an ethyl group or a phenyl group.

$R^Y$ and $R^Z$ each represent preferably a monovalent hydrocarbon group having 1 to 20 carbon atoms, more preferably a monovalent chain hydrocarbon group having 1 to 10 carbon atoms or a monovalent alicyclic hydrocarbon group having 3 to 20 carbon atoms, still more preferably an alkyl group having 1 to 10 carbon atoms or an alicyclic saturated hydrocarbon group having 3 to 20 carbon atoms, and particularly preferably a methyl group, an ethyl group or an adamantyl group.

Examples of the ring structure having 3 to 20 ring atoms which may be taken together represented by $R^Y$ and $R^Z$ groups include monocyclic saturated alicyclic structures such as a cyclopentane structure and a cyclohexane structure, polycyclic saturated alicyclic structures such as a norbornane structure and an adamantane structure, and the like. Of these, the monocyclic saturated alicyclic structures are preferred, the cycloalkane structure is more preferred, and the cyclohexane structure is still more preferred.

The lower limit of the proportion of the structural unit (IV) contained is preferably 5 mol %, more preferably 10 mol %, still more preferably 15 mol %, and particularly preferably 20 mol %. The upper limit of the proportion of the structural unit (IV) contained is preferably 60 mol %, more preferably 50 mol %, still more preferably 40 mol %, and particularly preferably 30 mol %.

Other Structural Unit

The polymer (A) may have a structural unit other than the structural units (I) to (IV). The other structural unit is exemplified by a structural unit that includes a nondissociable hydrocarbon group, and the like. The upper limit of the proportion of the other structural unit contained with respect to the total structural units constituting the polymer (A) is preferably 20 mol %, and more preferably 10 mol %.

In a case in which the metal atom is a tin atom, examples of the polymer (A) include compounds represented by the following formulae (i-1-1) to (i-1-7), (i-2-1) and (i-3-1) to (i-3-9), and the like.

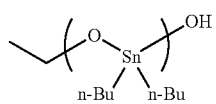

(i-1-1)

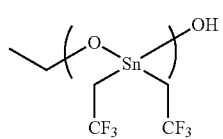

(i-1-2)

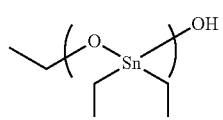

(i-1-3)

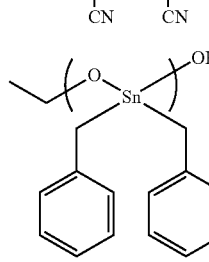

(i-1-4)

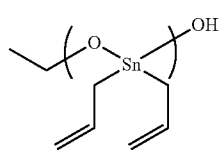

(i-1-5)

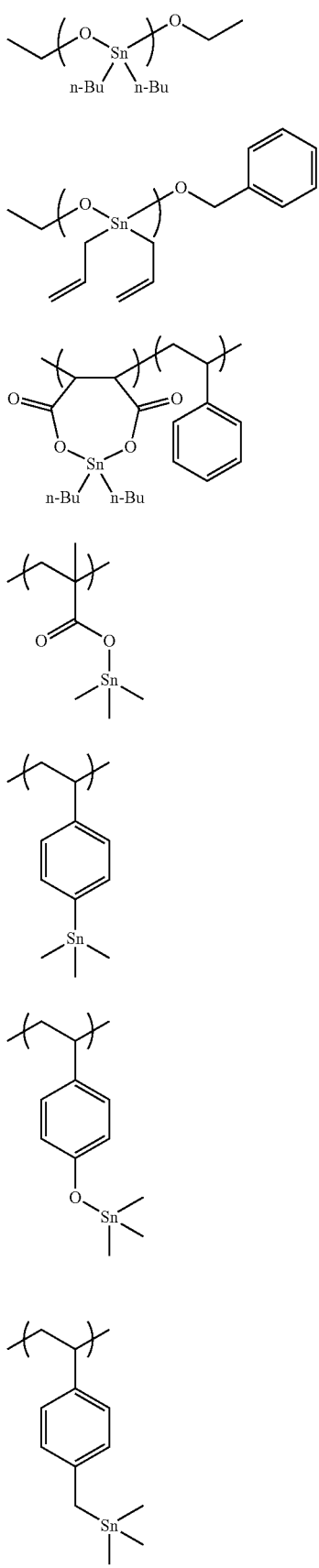
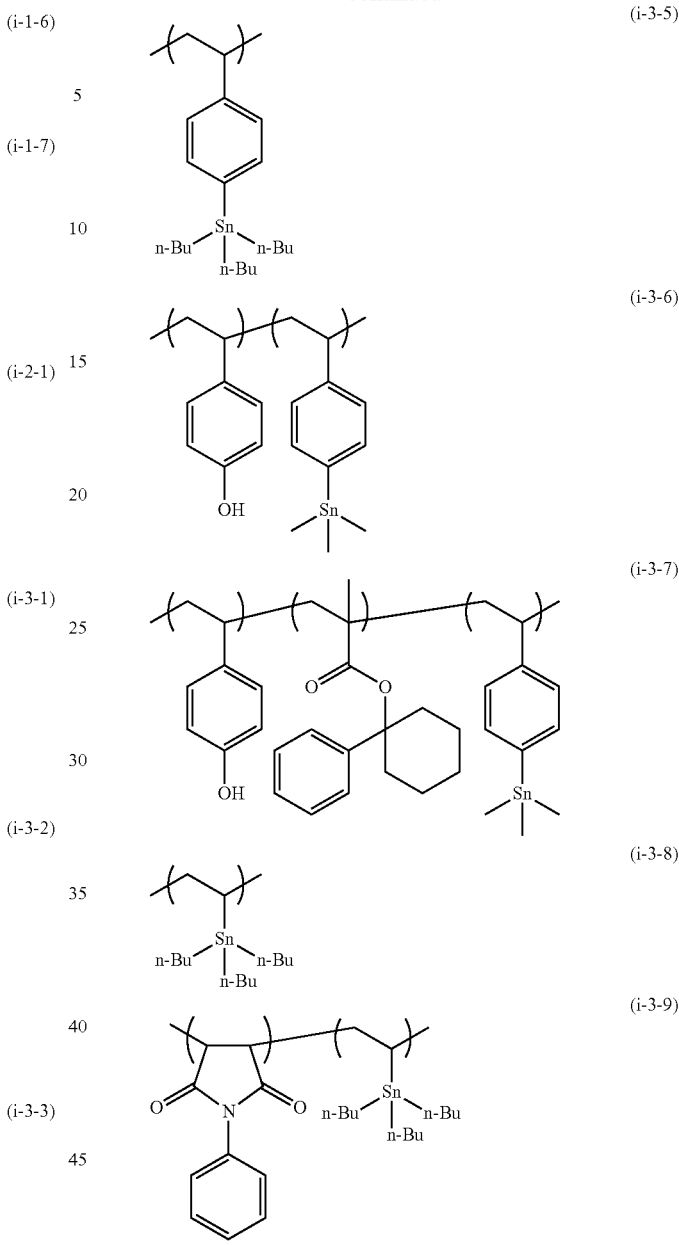

The lower limit of the weight average molecular weight (Mw) of the polymer (A) is preferably 700, more preferably 1,000, still more preferably 1,200, and particularly preferably 1,400. The upper limit of the Mw is preferably 20,000, more preferably 10,000, still more preferably 8,000, and particularly preferably 7,000. When the Mw of the polymer (A) falls within the above range, the sensitivity, the coating characteristics, the inhibitory ability of defects and storage stability, of the radiation-sensitive composition, can be more improved.

Production Method of Polymer (A) (Metal-Containing Resin)

In a case of having the structural unit (1-1), the polymer (A) may be produced conveniently with favorable yield by, for example, a production method of a metal-containing resin which includes subjecting the compound (I), etc., to a hydrolysis reaction in the presence of water. In this case, a base catalyst or an acid catalyst may be used, and a solvent other than water such as alcohol may be present together.

Alternatively, the metal-containing resin may be produced conveniently with favorable yield by a production method of a metal-containing resin which includes forming a main chain of a polymer by chain polymerization with a radical, an anion or a cation.

In a case of having the structural unit (I-2) and/or the structural unit (I-3), the polymer (A) may be synthesized by, for example, subjecting a compound having a polymerizable carbon-carbon double bond and including a metal atom that gives the structural unit (I-2) and/or (I-3), and, as needed, other monomer to a chain polymerization reaction with a radical, an anion or a cation, whereby a main chain of the polymer is formed. The chain polymerization reaction may be carried out by, for example, by using a radical polymerization initiator such as dimethyl 2,2'-azobis(2-methylpropionate) or 2,2'-azobisisobutyronitrile, an anion polymerization initiator such as n-butyllithium, a cation polymerization initiator such as cyclohexyl p-toluenesulfonate, etc., in an appropriate solvent such as toluene, 2-butanone and tetrahydrofuran. The temperature of the chain polymerization reaction may be, for example, no less than −20° C. and no greater than 150° C. in the radical polymerization, no less than −100° C. and no greater than 50° C. in the anion polymerization, and no less than −120° C. and no greater than 50° C. in the cation polymerization. A time period of the chain polymerization reaction is, for example, no less than 10 min and no greater than 24 hrs, and preferably no less than 1 hour and no greater than 12 hrs.

(B) Solvent

The solvent (B) is not particularly limited as long as it is a solvent capable of dissolving or dispersing at least the polymer (A), and optional component(s) which may be contained as desired, etc. A solvent used in the synthesis of the polymer (A) may be used as the solvent (B).

The solvent (B) is exemplified by an alcohol solvent, an ether solvent, a ketone solvent, an amide solvent, an ester solvent, a hydrocarbon solvent and the like.

Examples of the alcohol solvent include:

monohydric alcohol solvents having 1 to 12 carbon atoms such as methanol, ethanol, n-propanol, iso-propanol, n-butanol, iso-butanol, sec-butanol, tert-butanol, n-pentanol and iso-pentanol;

polyhydric alcohol solvents having 1 to 10 carbon atoms such as ethylene glycol, 1,2-propylene glycol, 1,3-butylene glycol, 2,4-pentanediol, diethylene glycol, dipropylene glycol, triethylene glycol and tripropylene glycol;

polyhydric alcohol partial ether solvents such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether and dipropylene glycol monoethyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-iso-butyl ketone and trimethylnonanone:

cyclic ketone solvents such as cyclopentanone, cyclohexanone, cycloheptanone, cyclooctanone and methylcyclohexanone:

2,4-pentanedione, acetonylacetone and acetophenone; and the like.

Examples of the amide solvent include:

cyclic amide solvents such as N,N'-dimethylimidazolidinone and N-methylpyrrolidone;

chainamide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

acetic acid ester solvents such as methyl acetate, ethyl acetate, n-propyl acetate, iso-propyl acetate, n-butyl acetate, iso-butyl acetate and sec-butyl acetate;

polyhydric alcohol partial ether carboxylate solvents such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate and propylene glycol monopropyl ether acetate;

lactone solvents such as γ-butyrolactone and δ-valerolactone;

carbonate solvents such as dimethyl carbonate, diethyl carbonate, ethylene carbonate and propylene carbonate;

ester lactate solvents such as methyl lactate, ethyl lactate, n-butyl lactate and n-amyl lactate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, the ester solvents are preferred, the polyhydric alcohol partial ether carboxylate solvents are more preferred, and propylene glycol monomethyl ether acetate is still more preferred. The radiation-sensitive composition may contain one, or two or more types of the solvent (B).

(C) Acid Generator

The radiation-sensitive composition may contain the acid generator (C). The acid generator (C) in the radiation-sensitive composition acid may be contained in the form of a low-molecular weight compound (hereinafter, may be also referred to as "acid generating agent (C)" as appropriate) or in the form incorporated as a part of the polymer (A), etc., or may be in both of these forms.

The acid generating agent (C) is exemplified by an onium salt compound, an N-sulfonyloxyimide compound, a halogen-containing compound, a diazo ketone compound, and the like.

Examples of the onium salt compound include a sulfonium salt, a tetrahydrothiophenium salt, an iodonium salt, a phosphonium salt, a diazonium salt, a pyridinium salt, and the like.

Specific examples of a radiation-sensitive acid generating agent include compounds disclosed in paragraphs [0160] to [0296] of Japanese Unexamined Patent Application, Publication No. 2010-164958, and the like.

In a case in which the radiation-sensitive composition contains the radiation-sensitive acid generating agent, the lower limit of the content of the radiation-sensitive acid generating agent with respect to 100 parts by mass of the polymer (A) is preferably 0.1 parts by mass, more preferably 1 part by mass, and still more preferably 5 parts by mass. The upper limit of the content is preferably 30 parts by mass, more preferably 20 parts by mass, and still more preferably 10 parts by mass. The radiation-sensitive composition may contain one, or two or more types of the acid generator (C).

Other Optional Components

The radiation-sensitive composition may contain in addition to the components (A) to (C) described above, an acid diffusion controller, a fluorine atom-containing polymer, a surfactant and the like, for example, as other optional components. The radiation-sensitive composition may contain one, or two or more types of each optional component.

Acid Diffusion Controller

The radiation-sensitive composition may contain as needed, an acid diffusion controller. The acid diffusion controller controls a phenomenon of diffusion of the acid, which was generated from the acid generator (C), etc. upon the exposure, in the film, whereby the effect of inhibiting unwanted chemical reactions in an unexposed region is exhibited. In addition, the storage stability of the radiation-sensitive composition is more improved and the resolution thereof as a resist is more improved. Moreover, variation of the line width of the pattern caused by variation of post-exposure time delay from the exposure until a development treatment can be suppressed, which enables the radiation-sensitive composition with superior process stability to be obtained. The acid diffusion controller may be contained in the radiation-sensitive composition in the form of a free compound (hereinafter, may be referred to as "acid diffusion control agent" as appropriate) or in the form incorporated as a part of the polymer, or may be in both of these forms.

Examples of the acid diffusion control agent include basic compounds disclosed in [0118] to [0119] of Japanese Unexamined Patent Application, Publication No. 2010-164958, amino compounds disclosed in [0018] to [0033] of WO 2011/007780, and compounds having a carbamate group disclosed in [0120] to [0121] of Japanese Unexamined Patent Application, Publication No. 2001-166476.

Also, as the acid diffusion control agent, a photodegradable base may be used which generates a weak acid through photosensitization upon an exposure. The photodegradable base is exemplified by an onium salt compound that loses acid diffusion controllability through degradation upon an exposure, and the like. Examples of the onium salt compound include photosensitive basic compounds that lose basicity upon irradiation with a radioactive ray as disclosed in [0123] to [0124] of Japanese Unexamined Patent Application, Publication No. 2007-114431, carboxylic acid onium salts disclosed in [0125] to [0126] of Japanese Unexamined Patent Application, Publication No. 2002-122994, onium salts of an alkanesulfonic acid having sulfonic acid unsubstituted with a fluorine atom at α-position as disclosed in [0127] to [0128] of Japanese Unexamined Patent Application, Publication No. 2003-005376, and the like.

In the case in which the radiation-sensitive composition contains the acid diffusion control agent, the lower limit of the content of the acid diffusion control agent with respect to 100 parts by mass of the polymer (A) is preferably 0.1 parts by mass, more preferably 0.5 parts by mass, and still more preferably 1 part by mass. The upper limit of the content is preferably 20 parts by mass, more preferably 10 parts by mass, and still more preferably 5 parts by mass. One, or two or more types of the acid diffusion controller may be used. [0120]

Fluorine Atom-Containing Polymer

The fluorine atom-containing polymer is a polymer having a fluorine atom. When the radiation-sensitive composition contains the fluorine atom-containing polymer, in forming the film, the fluorine atom-containing polymer tends to be localized in the surface region of the film due to oil-repellent characteristics thereof in the film. Thus, preventing the radiation-sensitive acid generator, the acid diffusion controller and the like used in liquid immersion lithography, etc., from elution into the liquid immersion medium is enabled. Moreover, due to the water-repellent characteristics of the fluorine atom-containing polymer, an advancing contact angle of a liquid immersion medium on the film can be controlled to fall within a desired range, thereby enabling generation of bubble defects to be inhibited. Furthermore, a greater receding contact angle of the liquid immersion medium on the film is attained, whereby an exposure by high-speed scanning without being accompanied by residual water beads is enabled. Accordingly, when the radiation-sensitive composition contains the fluorine atom-containing polymer, formation of a film suitable for liquid immersion lithography is enabled.

The fluorine atom-containing polymer is exemplified by a polymer having solubility in an alkaline developer solution that is increased by an action of an acid (polymer having an acid-labile group), a polymer having solubility that is increased by an action of an alkaline developer solution (polymer having an alkali-labile group), a polymer that does not react with an acid or an alkali (polymer not having either an acid-labile group or an alkali-labile group) and the like.

In a case in which the radiation-sensitive composition contains the fluorine atom-containing polymer, the lower limit of the content of the fluorine atom-containing polymer with respect to 100 parts by mass of the polymer (A) is preferably 0.1 parts by mass, more preferably 0.5 parts by mass, and still more preferably 1 part by mass. The upper limit of the content is preferably 20 parts by mass, more preferably 15 parts by mass, and still more preferably 10 parts by mass.

Surfactant

The surfactant achieves the effect of improving the coating characteristics, striation, developability, and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; and the like. Examples of a commercially available product of the surfactant include KP341 (available from Shin-Etsu Chemical Co., Ltd.), Polyflow No. 75 and Polyflow No. 95 (each available from Kyoeisha Chemical Co., Ltd.), EFTOP EF301, EFTOP EF303 and EFTOP EF352 (each available from Tochem Products Co. Ltd.), Megaface F171 and Megaface F173 (each available from DIC Corporation), Fluorad FC430 and Fluorad FC431 (each available from Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (each available from Asahi Glass Co., Ltd.), and the like.

In a case in which the radiation-sensitive composition contains the surfactant, the lower limit of the content of the surfactant with respect to 100 parts by mass of the polymer (A) is preferably 0.1 parts by mass, and more preferably 0.3 parts by mass. The upper limit of the content is preferably 2 parts by mass, and more preferably 1 part by mass.

Preparation Method of Radiation-Sensitive Composition

The radiation-sensitive composition may be prepared, for example, by mixing at a certain ratio, the polymer (A) and the solvent (B), as well as if necessary the optional component(s), preferably followed by filtering a mixture thus obtained through a membrane filter, etc. having a pore size of about 0.2 μm. The lower limit of the solid content concentration of the radiation-sensitive composition is preferably 0.1% by mass, more preferably 0.5% by mass, still more preferably 1% by mass, and particularly preferably 1.5% by mass. The upper limit of the solid content concentration is preferably 50% by mass, more preferably 30% by mass, still more preferably 10% by mass, and particularly preferably 5% by mass.

The radiation-sensitive composition may be used: for a development with an alkali in which an alkaline aqueous solution is used as a developer solution; or for a development with an organic solvent in which a development solution containing an organic solvent is used as a developer solution.

Pattern-Forming Method

The pattern-forming method of the embodiment of the invention includes the steps of: applying the radiation-sensitive composition described above directly or indirectly on one face side of a substrate (hereinafter, may be also referred to as "applying step"); exposing a film provided by the applying (hereinafter, may be also referred to as "exposure step"); and developing the film exposed (hereinafter, may be also referred to as "development step"). Since the radiation-sensitive composition of the embodiment of the present invention is used, the pattern-forming method enables a pattern to be formed with less defect. Each step will be described below.

Applying Step

In this step, the radiation-sensitive composition is applied directly or indirectly on an upper face side of a substrate. Thus, a film is formed. The application procedure is not particularly limited, and application means such as e.g., spin-coating, cast coating or roll coating may be employed. The substrate is exemplified by a silicon wafer, a wafer coated with aluminum, and the like. Specifically, after the radiation-sensitive composition is applied such that the resultant film has a predetermined thickness, prebaking (PB) is executed as needed to evaporate off the solvent in the coating film.

The lower limit of the average thickness of the film is preferably 1 nm, more preferably 10 nm, still more preferably 20 nm, and particularly preferably 30 nm. The upper limit of the average thickness is preferably 1,000 nm, more preferably 200 nm, still more preferably 100 nm, and particularly preferably 70 nm.

The lower limit of the temperature of PB is preferably 60° C., and more preferably 80° C. The upper limit of the temperature of PB is preferably 140° C., and more preferably 120° C. The lower limit of the time period of PB is preferably 5 sec, and more preferably 10 sec. The upper limit of the time period of PB is preferably 600 sec, and more preferably 300 sec.

Exposure Step

In this step, the film formed by the applying step is exposed. The exposure is carried out by irradiating with a radioactive ray through a mask having a predetermined pattern via a liquid immersion medium such as water, as the case may be. Examples of the radioactive ray include: electromagnetic waves such as a visible light ray, an ultraviolet ray, a far ultraviolet ray, a vacuum ultraviolet ray (extreme ultraviolet ray (EUV); wavelength: 13.5 nm), an X-ray and a γ-ray; charged particle rays such as an electron beam and an α-ray; and the like. Of these, radioactive rays that allow the covalent bond between the metal and the nonmetal included in the polymer (A) to be cleaved by the exposure are preferred, and EUV and an electron beam are more preferred.

In addition, post exposure baking (PEB) may be carried out after the exposure. The lower limit of the temperature of PEB is preferably 50° C., and more preferably 80° C. The upper limit of the temperature of PEB is preferably 180° C., and more preferably 130° C. The lower limit of the time period of PEB is preferably 5 sec, and more preferably 10 sec. The upper limit of the time period of PEB is preferably 600 sec, and more preferably 300 sec.

In the embodiment of the present invention, in order to maximize the potential ability of the radiation-sensitive composition, for example, an organic or inorganic antireflective film may be formed on the substrate employed. In addition, in order to prevent influences of basic impurities etc., included in the environment atmosphere, a protective film may be also provided on the coating film, for example. Furthermore, in a case where an exposure by way of liquid immersion is carried out, in order to avoid direct contact of the film with the liquid immersion medium, a protective film for liquid immersion may be also provided on the film, for example.

Development Step

In this step, the film exposed in the exposure step is developed. A developer solution for use in the development is exemplified by an aqueous alkali solution, a developer solution containing an organic solvent, and the like.

Examples of the aqueous alkali solution include alkaline aqueous solutions prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyl di methyl amine, triethanolamine, tetramethylammonium hydroxide (TMAH), pyrrole, piperidine, choline, 1,8-diazabicyclo-[5.4.0]-7-undecene and 1,5-diazabicyclo-[4.3.0]-5-nonene, and the like.

The lower limit of the content of the alkaline compound in the aqueous alkali solution is preferably 0.1% by mass, more preferably 0.5% by mass, and still more preferably 1% by mass. The upper limit of the content is preferably 20% by mass, more preferably 10% by mass, and still more preferably 5% by mass.

The aqueous alkali solution is preferably an aqueous TMAH solution, and more preferably a 2.38% by mass aqueous TMAH solution.

Exemplary organic solvent in the developer solution containing an organic solvent includes those similar to the organic solvents exemplified as the solvent (B) of the radiation-sensitive composition, and the like. Of these, the ester solvent, the ether solvent, the alcohol solvent, the ketone solvent, the amide solvent, the hydrocarbon solvent or a combination thereof is preferably contained, the ester solvent is more preferably contained, the ester solvent is still more preferred, and propylene glycol monomethyl ether acetate is particularly preferred.

The lower limit of the content of the organic solvent in the organic solvent developer solution is preferably 80% by mass, more preferably 90% by mass, still more preferably 95% by mass, and particularly preferably 99% by mass.

These developer solutions may be used either alone of one type, or two or more types thereof in combination. It is to be noted that the development is typically followed by washing with water, etc., and drying.

A positive tone pattern can be obtained when the alkali aqueous solution is used as the developer solution. Whereas a negative tone pattern can be obtained when the developer solution containing an organic solvent is used as the developer solution.

EXAMPLES

Hereinafter, the present invention is explained in detail by way of Examples, but the present invention is not in any way limited to these Examples. Each physical property value was determined by the following method.

Weight Average Molecular Weight (Mw)

The weight average molecular weight (Mw) of the polymer was determined by gel permeation chromatography (GPC) using GPC columns ("G2000HXL"×2, "G3000HXL"×1 and "G4000HXL"×1, Tosoh Corporation) under the analytical conditions involving a flow rate: 1.0 mL/min, an elution solvent: tetrahydrofuran, a sample concentration: 1.0% by mass, an amount of injected sample: 100 μL, a column temperature: 40° C., and a detector: differential refractometer, with mono-dispersed polystyrene as a standard.

Synthesis of Polymer (A)

Example 1

Dibutyltin dichloride in an amount of 3.04 g was dissolved in 30 g of propylene glycol monoethyl ether, and 0.36 g of water was added thereto. The mixture was stirred at 40° C. for 6 hrs to permit hydrolysis, whereby a polymer represented by the following formula (A-1) was obtained. The polymer (A-1) had Mw of 1,200.

Examples 2 to 5, 16 and 17

Polymers represented by the following formulae (A-2) to (A-5), (A-16) and (A-17) were obtained in a similar manner to Example 1 by way of appropriately selecting the monomers.

Example 8

A monomer solution was prepared by dissolving 20 g of a compound represented by the following formula (M-1) in 40 g of 2-butanone, and charging with 0.66 g of dimethyl 2,2'-azobis(2-methylpropionate) as a radical polymerization initiator. Also, a three-neck flask containing 20 g of 2-butanone was purged with nitrogen for 30 min. After the purging with nitrogen, the reaction vessel was heated to 80° C. while stirring was carried out, and the monomer solution prepared as described above was added dropwise over 3 hrs using a dropping funnel. The time of the start of the dropwise addition was regarded as the time of the start of the polymerization, and the polymerization reaction was carried out for 6 hrs. After completion of the polymerization, the polymerization reaction liquid was cooled to 30° C. or below by water cooling. The liquid was charged into 400 g of methanol, and thus precipitated white powder was filtered off. The white powder thus filtered off was washed twice with each 100 g of methanol in a slurry form, and thereafter filtered off and fried at 50° C. for 17 hrs to give a polymer represented by the following formula (A-8) as white powder with favorable yield. The polymer (A-8) had Mw of 4,500, and Mw/Mn of 1.40.

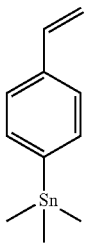

(M-1)

Examples 6, 7 and 9 to 15

Polymers represented by the following formulae (A-6), (A-7) and (A-9) to (A-15) were obtained in a similar manner to Example 8 by way of appropriately selecting the monomers.

In the following formulae (A-1) to (A-17), the denotation "( )", i.e., parentheses, indicates that the structural unit is repeated a plurality of times, and the number appended on the right side of "( )", i.e., parentheses, indicates the proportion of the structural unit contained (mol %). In addition, Mw values of the polymers (A-1) to (A-17) are shown in Table 1 below.

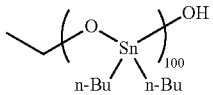

(A-1)

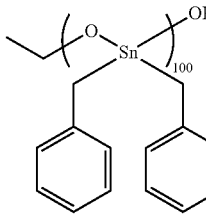

(A-2)

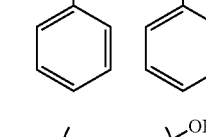

(A-3)

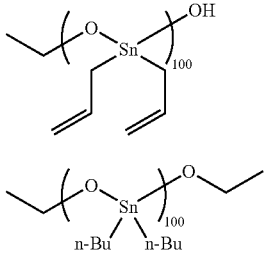

(A-4)

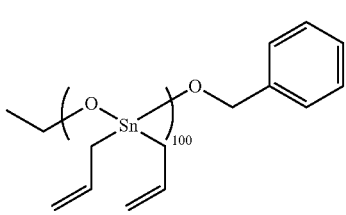

(A-5)

(A-6) 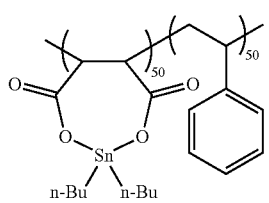
(A-7) 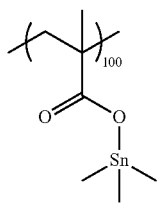
(A-8) 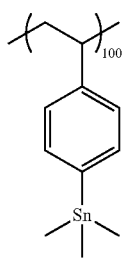
(A-9) 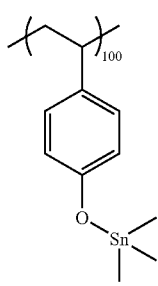
(A-10) 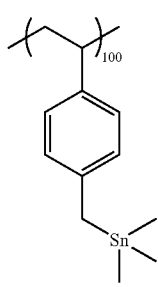
(A-11) 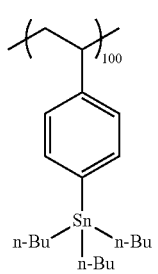
(A-12) 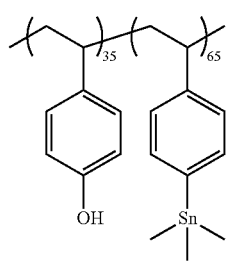
(A-13) 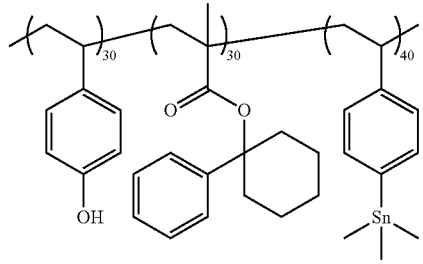
(A-14) 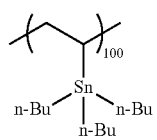
(A-15) 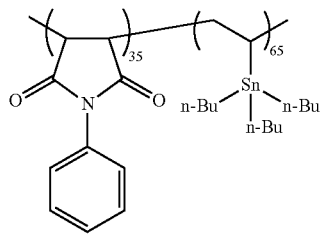
(A-16) 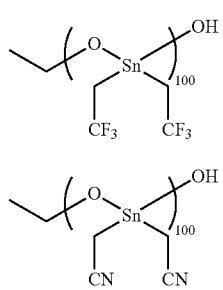
(A-17)
Preparation of Radiation-Sensitive Composition
The polymer (A), the solvent (B) and the acid generating agent (C) used in preparing the radiation-sensitive compositions are shown below.
(A) Component
Examples 18 to 34: polymers (A-1) to (A-17) synthesized as described above
Comparative Examples 1 to 3: compounds represented by the following formulae (a-1) to (a-3)
(a-1) 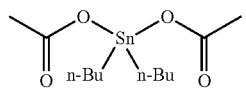

-continued

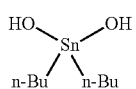
(a-2)

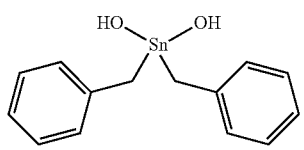
(a-3)

(B) Solvent
B-1: propylene glycol monomethyl ether acetate
(C) Acid Generating Agent
C-1: triphenylsulfonium 10-camphorsulfonate (compound represented by the following formula (C-1))

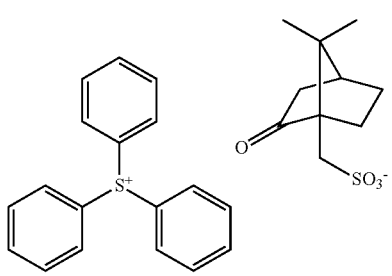
(C-1)

Example 18

A radiation-sensitive composition (J-1) was prepared by dissolving 3 parts by mass of (A-1) as the polymer (A) in 97 parts by mass of (B-1) as the solvent (B), and filtering a thus obtained mixture through a membrane filter having a pore size of 0.20 μm.

Examples 19 to 34 and Comparative Examples 1 to 3

Radiation-sensitive compositions (J-2) to (J-17) and (CJ-1) to (CJ-3) were prepared in a similar manner to Example 1 except that each component of the type and the amount shown in Table 1 below was used. In Table 1, "-" indicates that a corresponding component was not used.

Comparative Example 4

A resist precursor solution was prepared according to a method described in Example 1 of Japanese Unexamined Patent Application (Translation of PCT Application), Publication No. 2016-530565 to give a radiation-sensitive composition (CJ-4). The denotation "*1" for Comparative Example 4 in Table 1 below indicates that the radiation-sensitive composition (CJ-4) was prepared according to the aforementioned method.

Comparative Example 5

A divinyltin hydroxide solution was prepared according to a method described in Example 5 of Japanese Unexamined Patent Application (Translation of PCT Application), Publication No. 2016-530565 to give a radiation-sensitive composition (CJ-5). The denotation "*1" for Comparative Example 5 in Table 1 below indicates that the radiation-sensitive composition (CJ-5) was prepared according to the aforementioned method.

TABLE 1

|  | Radiation-sensitive composition | (A) Component type | Mw | content (parts by mass) | (B) Solvent type | content (parts by mass) | (C) Acid generating agent type | content (parts by mass) |
|---|---|---|---|---|---|---|---|---|
| Example 18 | J-1 | A-1 | 1,200 | 3 | B-1 | 97 | — | — |
| Example 19 | J-2 | A-2 | 1,600 | 3 | B-1 | 97 | — | — |
| Example 20 | J-3 | A-3 | 1,200 | 3 | B-1 | 97 | — | — |
| Example 21 | J-4 | A-4 | 1,400 | 3 | B-1 | 97 | — | — |
| Example 22 | J-5 | A-5 | 1,300 | 3 | B-1 | 97 | — | — |
| Example 23 | J-6 | A-6 | 2,500 | 3 | B-1 | 97 | — | — |
| Example 24 | J-7 | A-7 | 6,000 | 2.7 | B-1 | 97 | C-1 | 0.3 |
| Example 25 | J-8 | A-8 | 4,500 | 3 | B-1 | 97 | — | — |
| Example 26 | J-9 | A-9 | 7,200 | 2.7 | B-1 | 97 | C-1 | 0.3 |
| Example 27 | J-10 | A-10 | 2,900 | 3 | B-1 | 97 | C-1 | 0.3 |
| Example 28 | J-11 | A-11 | 4,900 | 3 | B-1 | 97 | — | — |
| Example 29 | J-12 | A-12 | 4,800 | 3 | B-1 | 97 | — | — |
| Example 30 | J-13 | A-13 | 5,500 | 2.7 | B-1 | 97 | C-1 | 0.3 |
| Example 31 | J-14 | A-14 | 2,900 | 3 | B-1 | 97 | — | — |
| Example 32 | J-15 | A-15 | 6,000 | 3 | B-1 | 97 | — | — |
| Example 33 | J-16 | A-16 | 3,000 | 3 | B-1 | 97 | — | — |
| Example 34 | J-17 | A-17 | 4,000 | 3 | B-1 | 97 | — | — |
| Comparative Example 1 | CJ-1 | a-1 | 390 | 3 | B-1 | 97 | — | — |
| Comparative Example 2 | CJ-2 | a-2 | 610 | 3 | B-1 | 97 | — | — |
| Comparative Example 3 | CJ-3 | a-3 | 420 | 3 | B-1 | 97 | — | — |
| Comparative Example 4 | CJ-4 |  |  | (*1) |  |  |  |  |
| Comparative Example 5 | CJ-5 |  |  | (*1) |  |  |  |  |

Pattern Formation

After the radiation-sensitive composition prepared as described above was spin-coated on a silicon wafer, PB was carried out under a condition at 100° C. for 60 sec to form a film having an average thickness of 40 nm. Next, patterning was executed by exposure of the film using a vacuum ultraviolet light exposure system (NA: 0.3; dipole illumination). Thereafter, PEB was carried out under a condition at 150° C. for 60 sec, and then a development was conducted using 2-heptanone in accordance with a puddle procedure at 23° C. for 1 min, followed by drying to form a negative tone pattern.

Evaluations

With respect to the following items, evaluations were made on the radiation-sensitive composition prepared as described above or the pattern formed as described above through measurements. The results of the evaluations are shown together in Table 1 below.

Inhibitory Ability of Particle Generation

The radiation-sensitive composition prepared as described above was stirred at 23° C. for 6 hrs, and subjected to circulation filtration with an HDPE capsule filter available from Nippon Pall Corporation (pore size: 5 nm) at a flow rate of 15 L/hour such that the radiation-sensitive composition was passed through 25 times. Thus filtered liquid was packed into a glass bottle, and the number of particles having a size of no less than 15 nm was counted in 1 mL of the liquid by using a particle counter available from RION Co., Ltd. The inhibitory ability of particle generation was evaluated as: "favorable" in the case of the number of the particles being one or less; "somewhat favorable" in the case of the number of the particles being greater than one and 10 or less; and "unfavorable" in the case of the number of the particles being greater than 10.

Coating Characteristics

After the radiation-sensitive composition prepared as described above was applied on a 12-inch silicon wafer by using a coating development apparatus ("CLEAN TRACK ACT12" available from Tokyo Electron Limited) at a certain rotation frequency such that the average film thickness became 30 nm, and then baking was carried out at 100° C. for 30 sec. Thus coated substrate was visually observed on the presence/absence of coating unevenness, repelling and halation. The coating characteristics were evaluated as: "favorable" in the case of these problems were found; and "unfavorable" in the case of these problems were found.

Inhibitory Ability of Defects

The substrate used in the evaluation of the coating characteristics was inspected on a defect inspection apparatus ("2810" available from KLA-Tencor) to observe fine defects on an visually undetectable level. The number of defects with the size of no less than 50 nm was counted per the substrate. The inhibitory ability of defects was evaluated as: "favorable" in the case of the number being 10 or less; "somewhat favorable" in the case of the number being greater than 10 and 100 or less; and "unfavorable" in the case of the number being greater than 100.

Storage Stability (at 5° C., for 6 months)

In a nitrogen atmosphere, the radiation-sensitive composition prepared as described above was packed in a glass bottle which was then sealed, and stored in a dark room at 5° C. Six months later, the coating characteristics and the inhibitory ability of defects were evaluated. The results of the evaluations were recorded as "no problem" when any problem was not found, whereas problematic features were recorded when the problem was found.

(at 35° C., for 1 month)

In a nitrogen atmosphere, the radiation-sensitive composition prepared as described above was packed in a glass bottle which was then sealed, and stored in a dark room at 35° C. One month later, the coating characteristics and the inhibitory ability of defects were evaluated. The results of the evaluations were recorded as "no problem" when any problem was not found, whereas problematic features were recorded when the problem was found.

Sensitivity

In patterning with a vacuum ultraviolet ray, an exposure dose at which a line-and-space pattern (1L 1S) configured with a line part having a line width of 150 nm and a space part formed by neighboring line parts with an interval of 150 nm was formed to give a line width of 1:1 was defined as "optimal exposure dose", and the sensitivity (unit: $\mu C/cm^2$) was defined based on the optimal exposure dose. The sensitivity was evaluated as: "favorable" in the case of the sensitivity being no greater than 35 $\mu C/cm^2$; "somewhat favorable" in the case of the sensitivity being greater than 35 $\mu C/cm^2$ and no greater than 50 $\mu C/cm^2$; and "unfavorable" in the case of the sensitivity being greater than 50 $\mu C/cm^2$.

TABLE 2

| | Radiation-sensitive composition | Inhibitory ability of particle generation | Coating characteristics | Inhibitory ability of defects | Storage stability (5° C., 6 months) | Storage stability (35° C., 1 month) | Developer solution | Tone of pattern | Sensitivity ($\mu C/cm^2$) |
|---|---|---|---|---|---|---|---|---|---|
| Example 18 | J-1 | favorable | favorable | favorable | no problem | no problem | PGMEA | negative tone pattern | 30 |
| Example 19 | J-2 | favorable | favorable | favorable | no problem | no problem | PGMEA | negative tone pattern | 11 |
| Example 20 | J-3 | favorable | favorable | favorable | no problem | no problem | PGMEA | negative tone pattern | 12 |
| Example 21 | J-4 | favorable | favorable | favorable | no problem | no problem | PGMEA | negative tone pattern | 34 |
| Example 22 | J-5 | favorable | favorable | favorable | no problem | no problem | PGMEA | negative tone pattern | 13 |

TABLE 2-continued

| | Radiation-sensitive composition | Results of evaluations | | | | | | | |
|---|---|---|---|---|---|---|---|---|---|
| | | Inhibitory ability of particle generation | Coating characteristics | Inhibitory ability of defects | Storage stability (5° C., 6 months) | Storage stability (35° C., 1 month) | Developer solution | Tone of pattern | Sensitivity ($\mu C/cm^2$) |
| Example 23 | J-6 | favorable | favorable | favorable | no problem | no problem | PGMEA | negative tone pattern | 33 |
| Example 24 | J-7 | favorable | favorable | favorable | no problem | no problem | 2.38% by mass aqueous TMAH solution | positive tone pattern | 35 |
| Example 25 | J-8 | favorable | favorable | favorable | no problem | no problem | PGMEA | negative tone pattern | 35 |
| Example 26 | J-9 | favorable | favorable | favorable | no problem | no problem | 2.38% by mass aqueous TMAH solution | positive tone pattern | 29 |
| Example 27 | J-10 | favorable | favorable | favorable | no problem | no problem | PGMEA | negative tone pattern | 26 |
| Example 28 | J-11 | favorable | favorable | favorable | no problem | no problem | PGMEA | negative tone pattern | 27 |
| Example 29 | J-12 | favorable | favorable | favorable | no problem | no problem | PGMEA | negative tone pattern | 28 |
| Example 30 | J-13 | favorable | favorable | favorable | no problem | no problem | PGMEA | negative tone pattern | 29 |
| Example 31 | J-14 | favorable | favorable | favorable | no problem | no problem | PGMEA | negative tone pattern | 30 |
| Example 32 | J-15 | favorable | favorable | favorable | no problem | no problem | PGMEA | negative tone pattern | 32 |
| Example 33 | J-16 | favorable | favorable | favorable | no problem | no problem | PGMEA | negative tone pattern | 21 |
| Example 34 | J-17 | favorable | favorable | favorable | no problem | no problem | PGMEA | negative tone pattern | 23 |
| Comparative Example 1 | CJ-1 | somewhat favorable | favorable | Unfavorable | occurrence of repelling | occurrence of repelling, occurrence of unevenness of coating | PGMEA | negative tone pattern | 48 |
| Comparative Example 2 | CJ-2 | somewhat favorable | repelling | unfavorable | occurrence of repelling and halation | occurrence of repelling and halation | PGMEA | negative tone pattern | 51 |
| Comparative Example 3 | CJ-3 | Unfavorable | favorable | unfavorable | occurrence of halation | occurrence of halation | PGMEA | negative tone pattern | 35 |
| Comparative Example 4 | CJ-4 | Unfavorable | unfavorable | unfavorable | occurrence of repelling and halation | occurrence of repelling and halation | PGMEA | negative tone pattern | 35 |
| Comparative Example 5 | CJ-5 | favorable | unfavorable | unfavorable | occurrence of repelling and halation | occurrence of repelling and halation | PGMEA | negative tone pattern | 42 |

As is seen from the results shown in Table 2, the radiation-sensitive compositions of Examples are superior in sensitivity, accompanied by the smaller number of particles, with the coating characteristics being superior and the storage stability also being superior. Furthermore, the radiation-sensitive compositions of Examples enable the pattern to be formed with less defect.

The radiation-sensitive composition of the embodiment of the present invention is accompanied by superior sensitivity and inhibitory ability of particle generation, as well as superior coating characteristics and inhibitory ability of defects, and enables these performance to be maintained for a long period of time. The pattern-forming method of the embodiment of the present invention enables pattern to be formed with less defect. The metal-containing resin of the embodiment of the present invention can be suitably used as a polymer component of the radiation-sensitive composition. The production method of a metal-containing resin of the embodiment of the present invention enables the metal-containing resin to be readily produced with good yield. Therefore, these can be suitably used in manufacture of semiconductor devices in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive composition for exposure with an extreme ultraviolet ray or an electron beam, comprising:
   a polymer; and
   a solvent dissolving or dispersing the polymer,
   wherein the polymer comprises a structural unit comprising at least one formula selected from the group consisting of

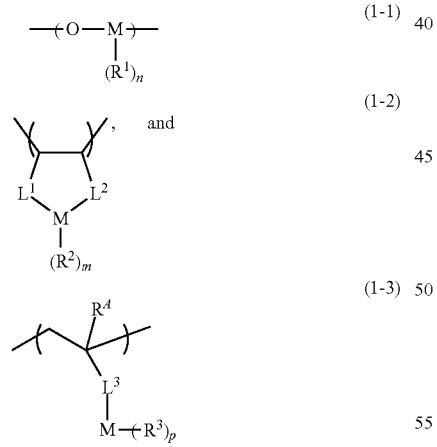

where M is a metal atom, $R^1$ is a monovalent organic group having 1 to 20 carbon atoms, n is an integer of 1 to 4 such that when n is no less than 2, a plurality of $R^1$s is identical or different, at least one $R^1$ bonds to M via a carbon atom that bonds to the metal atom by a covalent bond and does not constitute an unsaturated bond, $L^1$ and $L^2$ each independently are a divalent linking group having 1 to 30 atoms, $R^2$ is a monovalent organic group having 1 to 20 carbon atoms, m is an integer of 1 to 4 such that when m is no less than 2, a plurality of $R^2$s is identical or different, at least one of $L^1$, $L^2$ and at least one $R^2$ bonds to M via a carbon atom that bonds to the metal atom by a covalent bond and does not constitute an unsaturated bond, $R^4$ is a hydrogen atom or a monovalent organic group having 1 to 10 carbon atoms, $L^3$ is a divalent linking group having 1 to 30 atoms, $R^3$ is a monovalent organic group having 1 to 20 carbon atoms, p is an integer of 1 to 5 such that when p is no less than 2, a plurality of $R^3$s is identical or different, and at least one of $L^3$ and at least one $R^3$ bonds to M via a carbon atom that bonds to the metal atom by a covalent bond and does not constitute an unsaturated bond.

2. The radiation-sensitive composition according to claim 1, wherein every chemical bond is a covalent bond.

3. The radiation-sensitive composition according to claim 1, wherein the metal atom is tin, germanium, lead or a combination thereof.

4. The radiation-sensitive composition according to claim 1, wherein the metal atom is tin.

5. The radiation-sensitive composition according to claim 4, wherein the structural unit of the polymer comprises at least one formula selected from the group consisting of

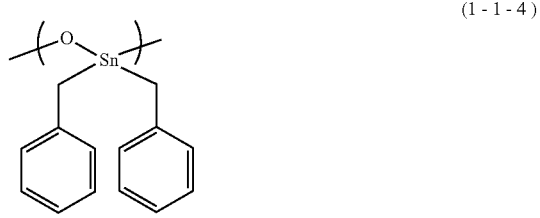

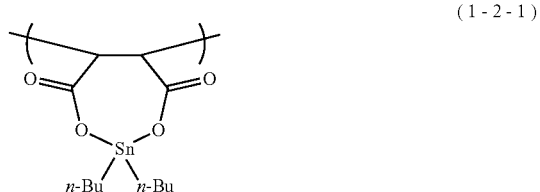

-continued (1-3-1)
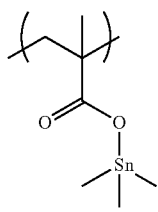

(1-3-2)
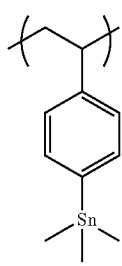

(1-3-3)
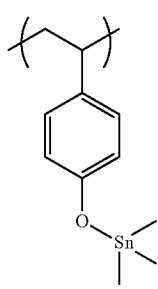

(1-3-4)
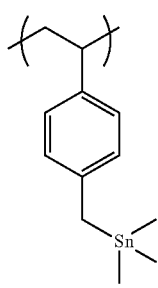

(1-3-5)
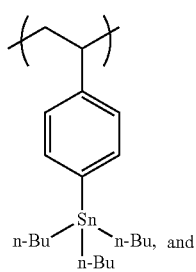, and (1-3-6)
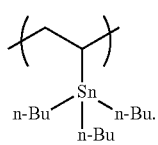.

6. The radiation-sensitive composition according to claim 4, wherein the structural unit of the polymer comprises at least one formula selected from the group consisting of (1-1-1)
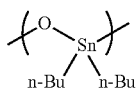

(1-1-2)
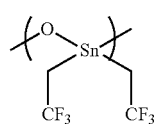

(1-1-3)
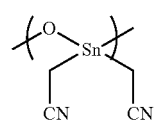

(1-1-4)
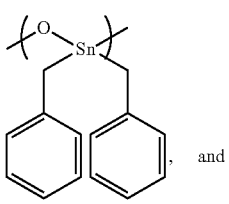, and (1-1-5)
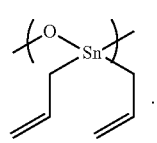.

7. The radiation-sensitive composition according to claim 4, wherein the structural unit of the polymer comprises (1-2-1)
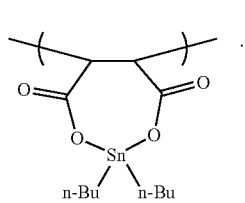.

8. The radiation-sensitive composition according to claim 4, wherein the structural unit of the polymer comprises at least one formula selected from the group consisting of (1-3-1)
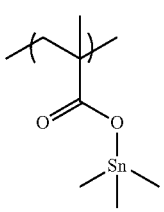

-continued (1-3-2)
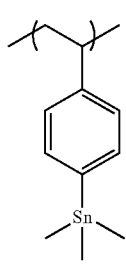

(1-3-3)
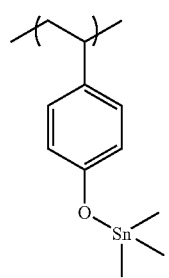

(1-3-4)
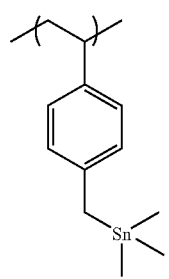

(1-3-5)
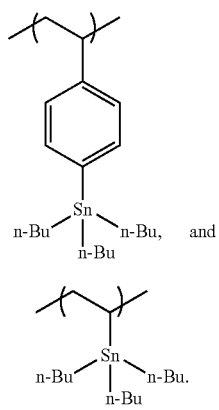

(1-3-6)
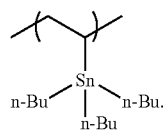

9. The radiation-sensitive composition according to claim 1, wherein a content of the polymer in terms of solid content equivalent is no less than 50% by mass.

10. The radiation-sensitive composition according to claim 1, wherein the solvent comprises an alcohol solvent, an ether solvent, a ketone solvent, an amide solvent, an ester solvent, a hydrocarbon solvent or a combination thereof.

11. The radiation-sensitive composition according to claim 10, wherein the solvent comprises an ester solvent comprising a polyhydric alcohol partially etherated carboxylate solvent.

12. The radiation-sensitive composition according to claim 1, wherein the polymer further comprises a second structural unit comprising a polar group.

13. The radiation-sensitive composition according to claim 1, wherein the polymer further comprises a third structural unit which is a structural unit other than the structural unit and comprises a crosslinkable group.

14. The radiation-sensitive composition according to claim 1, wherein the polymer comprises the metal atom in a side chain thereof.

15. The radiation-sensitive composition according to claim 1, further comprising a fluorine atom-containing polymer other than the polymer.

16. The radiation-sensitive composition according to claim 1, further comprising a surfactant.

17. A pattern-forming method comprising:
applying the radiation-sensitive composition of claim 1 directly or indirectly on one face side of a substrate such that a film comprising the radiation-sensitive composition is formed on the substrate;
exposing the film formed on the substrate; and
developing the film exposed on the substrate.

18. The pattern-forming method according to claim 17, wherein the developing includes applying a developer solution comprising an aqueous alkali solution.

19. The pattern-forming method according to claim 17, wherein the developing includes applying a developer solution comprising an organic solvent.

20. The pattern-forming method according to claim 19, wherein the organic solvent comprises an ester solvent, an ether solvent, an alcohol solvent, a ketone solvent, an amide solvent, a hydrocarbon solvent or a combination thereof.

21. The pattern-forming method according to any one of claim 17, wherein a radioactive ray is an extreme ultraviolet ray or an electron beam.

22. A metal-containing resin, comprising:
a polymer,
wherein the polymer comprises a structural unit comprising at least one formula selected from the group consisting of (1-1)
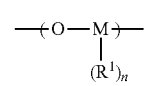

(1-2)
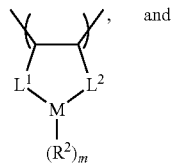
, and (1-3)
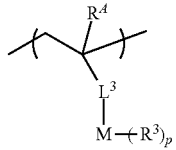

where M is a metal atom, $R^1$ is a monovalent organic group having 1 to 20 carbon atoms, n is an integer of 1 to 4 such that when n is no less than 2, a plurality of $R^1$s is identical or different, at least one $R^1$ bonds to M via a carbon atom that bonds to the metal atom by a covalent bond and does not constitute an unsaturated bond, $L^1$ and $L^2$ each independently are a divalent linking group having 1 to 30 atoms, $R^2$ is a monovalent organic group having 1 to 20 carbon atoms, in is an integer of 1 to 4 such that when in is no less than 2, a plurality of $R^2$s is identical or different, at least one of $L^1$, $L^2$ and at least one $R^2$ bonds to M via a carbon atom that bonds to the metal atom by a covalent bond and does not constitute an unsaturated bond, $R^A$ is a hydrogen atom or a monovalent organic group having 1 to 10 carbon atoms, $L^3$ is a divalent linking group having 1 to 30 atoms, $R^3$ is a monovalent organic group having 1 to 20 carbon atoms, p is an integer of 1 to 5 such that when p is no less than 2, a plurality of $R^3$s is identical or different, and at least one of $L^3$ and at least one $R^3$ bonds to M via a carbon atom that bonds to the metal atom by a covalent bond and does not constitute an unsaturated bond.

23. A method of producing a metal-containing resin, comprising:

forming a main chain of a polymer by chain polymerization with a radical, an anion or a cation such that the polymer comprises a structural unit comprising at least one formula selected from the group consisting of

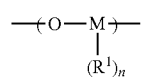
(1-1)

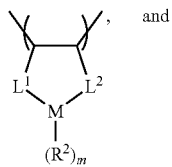
(1-2)

, and

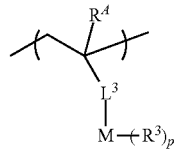
(1-3)

where M is a metal atom, $R^1$ is a monovalent organic group having 1 to 20 carbon atoms, n is an integer of 1 to 4 such that when n is no less than 2, a plurality of $R^1$s is identical or different, at least one $R^1$ bonds to M via a carbon atom that bonds to the metal atom by a covalent bond and does not constitute an unsaturated bond, $L^1$ and $L^2$ each independently are a divalent linking group having 1 to 30 atoms, $R^2$ is a monovalent organic group having 1 to 20 carbon atoms, m is an integer of 1 to 4 such that when m is no less than 2, a plurality of $R^2$s is identical or different, at least one of $L^1$, $L^2$ and at least one $R^2$ bonds to M via a carbon atom that bonds to the metal atom by a covalent bond and does not constitute an unsaturated bond, $R^A$ is a hydrogen atom or a monovalent organic group having 1 to 10 carbon atoms, $L^3$ is a divalent linking group having 1 to 30 atoms, $R^3$ is a monovalent organic group having 1 to 20 carbon atoms, p is an integer of 1 to 5 such that when p is no less than 2, a plurality of $R^3$s is identical or different, and at least one of $L^3$ and at least one $R^3$ bonds to M via a carbon atom that bonds to the metal atom by a covalent bond and does not constitute an unsaturated bond.

* * * * *

UNITED STATES PATENT AND TRADEMARK OFFICE
CERTIFICATE OF CORRECTION

| | |
|---|---|
| PATENT NO. | : 11,079,676 B2 |
| APPLICATION NO. | : 16/449701 |
| DATED | : August 3, 2021 |
| INVENTOR(S) | : Yusuke Asano et al. |

Page 1 of 1

It is certified that error appears in the above-identified patent and that said Letters Patent is hereby corrected as shown below:

In the Claims

Claim 22, Column 38, Line 65, "in is an integer of 1 to 4 such that when in is no less than 2," should read --- m is an integer of 1 to 4 such that when m is no less than 2, ---

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*